United States Patent [19]

Maei et al.

[11] Patent Number: 4,750,185

[45] Date of Patent: Jun. 7, 1988

[54] SEMICONDUCTOR LASER ARRAY DEVICE

[75] Inventors: Shigeki Maei, Tenri; Hiroshi Hayashi, Soraku; Saburo Yamamoto, Udo, all of Japan

[73] Assignee: Sharp Kabushiki Kaisha, Osaka, Japan

[21] Appl. No.: 833,321

[22] Filed: Feb. 27, 1986

[30] Foreign Application Priority Data

Feb. 28, 1985 [DE] Fed. Rep. of Germany ...... 60-41756

[51] Int. Cl.⁴ ............................................. N01S 3/19
[52] U.S. Cl. ...................................... 372/50; 372/45; 372/46; 372/48
[58] Field of Search ............... 372/50, 46, 45, 48

[56] References Cited

U.S. PATENT DOCUMENTS 4,185,256 1/1980 Scifres et al. .................. 372/46
4,385,389 5/1983 Botez ................................ 372/48
4,624,000 11/1986 Streifer et al. .................. 372/50

FOREIGN PATENT DOCUMENTS 0115390 1/1984 European Pat. Off. .
59-100583 10/1984 Japan .
85/00076 1/1985 PCT Int'l Appl. .

Primary Examiner—James W. Davie
Attorney, Agent, or Firm—Birch, Stewart, Kolasch & Birch

[57] ABSTRACT

A semiconductor laser array device comprising an active layer for laser oscillation having a plurality of curved portions at substantially right angles to the resonance direction to thereby create a distribution of the refractive index between the curved portions and the flat portions of the active layer, resulting in a plurality of laser oscillation operation areas which are positioned between the curved portions of the active layer and which are optically coupled therebetween.

6 Claims, 1 Drawing Sheet

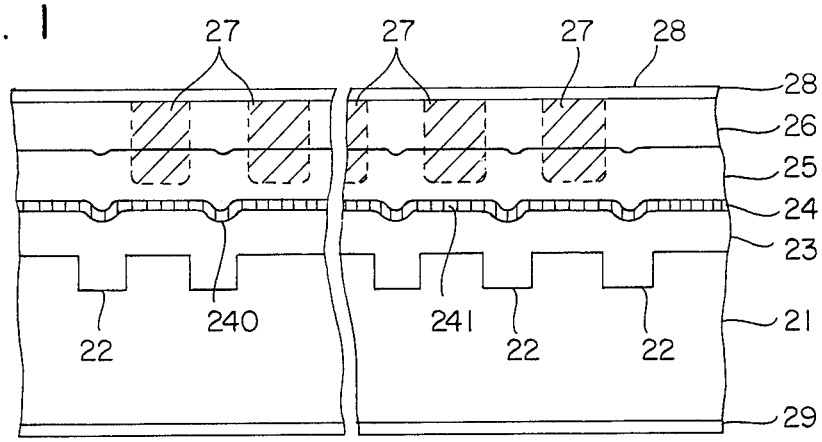
FIG. 1
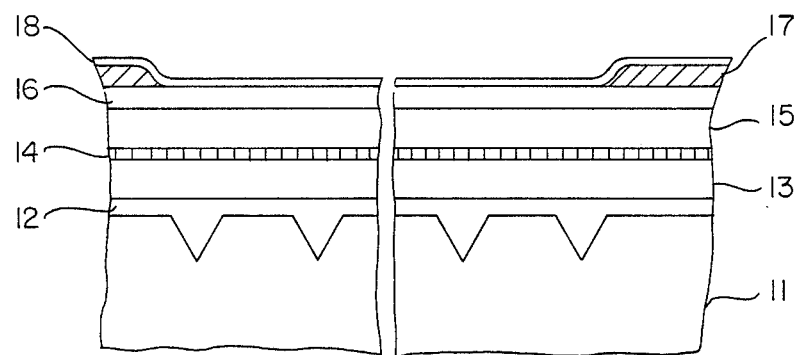
FIG. 2
PRIOR ART
FIG. 3(A)
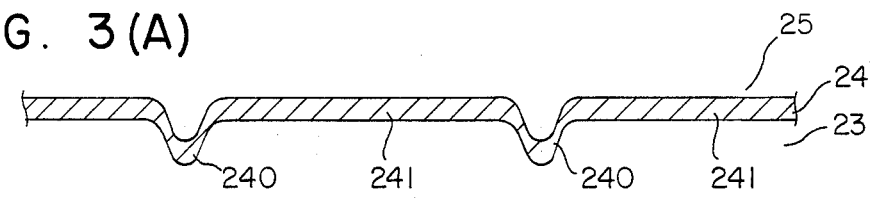
FIG. 3(B)
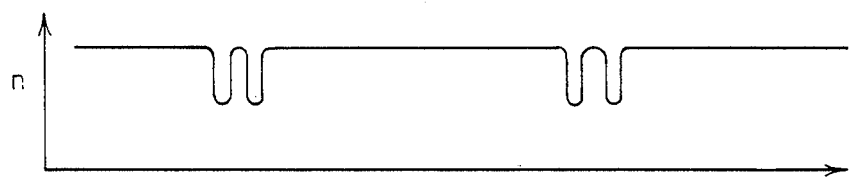

SEMICONDUCTOR LASER ARRAY DEVICE

BACKGROUND OF THE INVENTION

1. Field of the Invention

This invention relates to a semiconductor laser array device which is composed of a single semiconductor laser device having a plurality of resonators (i.e., active waveguides) for laser oscillation optically coupled therebetween, resulting in a semiconductor laser device with which high optical output power operation can be achieved.

2. Description of the prior art

Phase-synchronized laser arrays have been proposed in which a plurality of active waveguides are disposed in a parallel manner in a single semiconductor laser device to attain optical phase coupling therebetween, resulting in a laser device producing great output power with a single phase. One of these laser arrays in a CSP-LOC (channeled-substrate planar large-optical-cavity) laser device using a channeled substrate proposed by D. Botez et al., of RCA Laboratories, Fourth International Conference on Integrated Optics and Optical Fiber Communication, Abstract 29B52, June 27-30, 1983, Tokyo, Japan, which is shown in FIG. 2. This laser device is produced as follows: On an $n^+$-GaAs substrate 11 having a plurality of striped V-channels in a parallel manner thereon, an n-GaAlAs cladding layer 12, an n-GaAlAs optical guide layer 13, a GaAlAs active layer 14, a p-GaAlAs cladding layer 15, and a $p^+$-GaAs cap layer 16 are successively grown, followed by subjection to a vapor deposition treatment to form a $SiO_2$ insulating layer as an electric current blocking layer on the cap layer 16. Then, an ohmic electrode 18 is formed on the cap layer 16 and the insulating layer 17, resulting in the CSP-LOC laser device. This laser device has a disadvantage in that the amount of laser light absorbed into the GaAs substrate varies depending upon the distance from the active layer to the mesa-portion of the substrate. If the distance between the active layer and the mesaportion of the GaAs substrate is small, the amount of laser light absorbed into the GaAs substrate becomes great so that the laser device cannot produce high output power. If the distance therebetween is great, the refractive index difference required for stable laser oscillation cannot be created. Thus, a zero shift in the optical phase between the adjacent laser operation areas is unattainable.

SUMMARY OF THE INVENTION

The semiconductor laser array device of this invention which overcomes the above-discussed and numerous other disadvantages and deficiencies of the prior art, comprises an active layer for laser oscillation having a plurality of curved portions at substantially right angles to the resonance direction to thereby create a distribution of the refractive index between the curved portions and the flat portions of the active layer, resulting in a plurality of laser oscillation operation areas which are positioned between the curved portions of the active layer and which are optically coupled therebetween.

The curved portions of the active layer are, in a preferred embodiment, formed corresponding to a plurality of striped rectangular channels formed on a substrate.

Thus, the invention described herein makes possible the objects of (1) providing a semiconductor laser array device which is of an index guide type and which can minimize the loss of laser light at the region between the adjacent laser operation areas, thereby attaining stable optical-phase coupling between the adjacent laser operation areas with a zero phase shift therebetween; (2) providing a semiconductor laser array device in which a desired curvature of the curved portions of the active layer can be set to make a difference in the refractive index between the curved portions and the flat portions of the active layer, so that each of the resonators constituted between the curved portions of the active layer oscillates laser light in the fundamental transverse mode; and (3) providing a semiconductor laser array device which is useful for a laser light source for long distance optical communication systems, due to the above-mentioned advantages.

BRIEF DESCRIPTION OF THE DRAWINGS

This invention may be better understood and its numerous objects and advantages will become apparent to those skilled in the art by reference to the accompanying drawings as follows:

FIG. 1 is a cross sectional view showing a semiconductor laser array device of this invention.

FIG. 2 is a cross sectional view showing a conventional semiconductor laser array device.

FIG. 3(A) is a cross sectional view showing a partly enlarged portion of the semiconductor laser array device shown in FIG. 1.

FIG. 3(B) is a graph showing the distribution of the refractive index corresponding to the partly enlarged portion of the semiconductor laser array device shown in FIG. 3(A).

DESCRIPTION OF THE PREFERRED EMBODIMENTS

FIG. 1 shows a GaAlAs semiconductor laser array device of this invention, which is produced as follows: On an n-GaAs substrate 21, a plurality of striped rectangular channels 22 are formed in a parallel manner by photolithography. Then, on the channeled substrate 21, an $n-Ga_{1-x}Al_xAs$ cladding layer 23, a $Ga_{1-y}Al_yAs$ active layer 24 for laser oscillation, a $p-Ga_{1-x}Al_xAs$ cladding layer 25, and an n-GaAs cap layer 26 are successively grown by molecular beam epitaxy (MBE), metal organic chemical vapor deposition (MO-CVD) or liquid phase epitaxy (LPE), resulting in a double-heterostructure multi-layered crystal for laser operation. Then, p-impurities are diffused in the regions other than those corresponding to the rectangular channels 22 of the substrate 21 in the range from the surface of the n-GaAs cap layer 26 to the middle to the GaAlAs cladding layer 25 to form p-impurity diffusion regions 27 in which electric current is confined, resulting in a planar-striped structure. P-sided and n-sided ohmic electrodes 28 and 29 are formed on the cap layer 26 and the GaAs substrate 21, respectively, followed by cleaving to form facets for laser oscillation, resulting in a semiconductor laser array device.

When current is injected into the above-mentioned laser array device through the ohmic electrodes 28 and 29, it flows into each of the p-impurity diffusion regions 27 alone, and laser oscillation operation is carried out in the flat portions 241 of the active layer 24 corresponding to the said p-impurity diffusion regions 27. As mentioned above, it is in the flat portions 241 of the active layer 24 corresponding to the regions other than those of the rectangular channels 22 of the substrate 21 that laser oscillation operation arises. The rectangular channels 22 function to separate the laser oscillation operation areas from each other.

The striped rectangular channels 22 of the GaAs substrate 21 result in concaves on the n-cladding layer 23, and accordingly the active layer 24 which is grown on the n-cladding layer 23 serving as an underlying layer therefor has curved portions 240 corresponding to the rectangular channels 22. FIG. 3(A) shows the curved portions 240 of the active layer 24 in detail. FIG. 3(B) shows the distribution of the refractive index n corresponding to the active layer 24 shown in FIG. 3(A). Due to the curved shape of the active layer 24, distribution of the refractive index n is achieved, corresponding to the curved portions 240 at right angles to the resonance direction, within the active layer 24, and each of the regions positioned between the curved portions 240 functions as an independent laser light resonator, which constitutes a laser oscillation operation area. Laser lights existing within the adjacent resonators attain optical phase coupling therebetween through the curved portion 240 of the active layer 24 therebetween, so that high output power laser lights can be emitted with a zero phase shift therebetween from the whole of the laser oscillation areas. That is, the flat portions 241 of the active layer 24 which correspond to the electroconductive regions 27 carry out laser oscillation operation, and laser lights created in each of the flat portions 241 are transmitted to the adjacent laser oscillation operation areas to thereby attain optical phase coupling between the adjacent laser oscillation operation areas with a zero phase shift therebetween.

The above-mentioned Example discloses a GaAlAs semiconductor laser array device alone, but is not limited thereto. This invention is, of course, applicable to other semiconductor materials. Moreover, this invention is applicable to striped structures other than the planar-striped structure described herein.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A semiconductor laser array device comprising a structure which includes an active layer for laser oscillation, wherein said active layer contains a plurality of curved and flat portions, said curved portions being formed substantially perpendicular to the resonance direction so as to achieve distribution of the refractive index between said flat portions of said active layer, and so as to create a plurality of laser oscillation operation areas, said laser oscillation operation areas being positioned between said curved portions of said active layer and being optically coupled therebetween.

2. A semiconductor laser array device according to claim 1, wherein said structure includes a substrate having a plurality of striped rectangular channels formed thereon, said striped rectangular channels corresponding to said curved portions of said active layer.

3. A semiconductor laser array device according to claim 1, wherein said structure includes current confining stripes formed corresponding to said flat portions of said active layer.

4. A semiconductor laser array device according to claim 3, wherein said current confining stripes comprise impurity diffusion regions.

5. A semiconductor laser array device according to claim 2, wherein said structure includes a first cladding layer formed on said substrate, said active layer formed on said first cladding layer, a second cladding layer formed on said active layer, a cap layer formed on said second cladding layer, and electrodes formed on said cap layer and said substrate, and wherein impurity diffusion regions for confining current are formed in said cap layer and said second cladding layer.

6. A semiconductor laser array device according to claim 5, wherein said substrate and said cap layer comprise GaAs and wherein said first cladding layer, said active layer, and said second cladding layer comprise GaAlAs.

* * * * *